United States Patent
Kawashima

[11] Patent Number: 5,955,739
[45] Date of Patent: Sep. 21, 1999

[54] SURFACE POSITION DETECTION DEVICE

[75] Inventor: Haruna Kawashima, Utsunomiya, Japan

[73] Assignee: Canon Kabushiki Kaisha, Tokyo, Japan

[21] Appl. No.: 08/733,319

[22] Filed: Oct. 17, 1996

[30] Foreign Application Priority Data

Oct. 18, 1995 [JP] Japan ..................... 7-270013

[51] Int. Cl.$^6$ .................................................. G01B 11/00
[52] U.S. Cl. ..................... 250/548; 355/52; 356/400; 356/375; 250/559.22
[58] Field of Search ................ 250/548, 559.3, 250/559.22; 356/399–401, 375; 355/53, 52, 55

[56] References Cited

U.S. PATENT DOCUMENTS

| | | |
|---|---|---|
| 4,748,333 | 5/1988 | Mizutani et al. . |
| 5,118,957 | 6/1992 | Kawashima et al. . |
| 5,124,563 | 6/1992 | Kawashima et al. . |
| 5,323,016 | 6/1994 | Yamada et al. . |
| 5,414,515 | 5/1995 | Kawashima . |
| 5,602,400 | 2/1997 | Kawashima ............... 250/548 |
| 5,661,548 | 8/1997 | Imai ........................... 355/55 |

FOREIGN PATENT DOCUMENTS 62-299716  12/1987  Japan .
2-102518   4/1990   Japan .

Primary Examiner—Stephone B. Allen
Attorney, Agent, or Firm—Fitzpatrick, Cella, Harper & Scinto

[57] ABSTRACT

A surface position detection device detects the position of a surface to be detected with an uneven profile. The device includes an illumination unit, first and second imaging optical systems, a photodetector, and a position detector. The first imaging optical system projects the image of the object onto a surface to be detected. The second imaging optical system re-focuses the image of the object reflected from the surface to be detected. The photodetector detects the image re-focused by the second imaging optical system. The position detector detects the position of the surface to be detected, based on the signal generated by the photodetector. The first imaging optical system comprises a first aperture member defining the cone angle of a light ray flux projected onto the object, which is denoted as φTRANSMIT. The second imaging optical system comprises a second aperture member for defining the cone angle of the light ray flux, reflected from the surface to be detected, and detected by the photodetector, which is denoted as φRECEIVE. φTRANSMIT≧φRECEIVE.

15 Claims, 16 Drawing Sheets

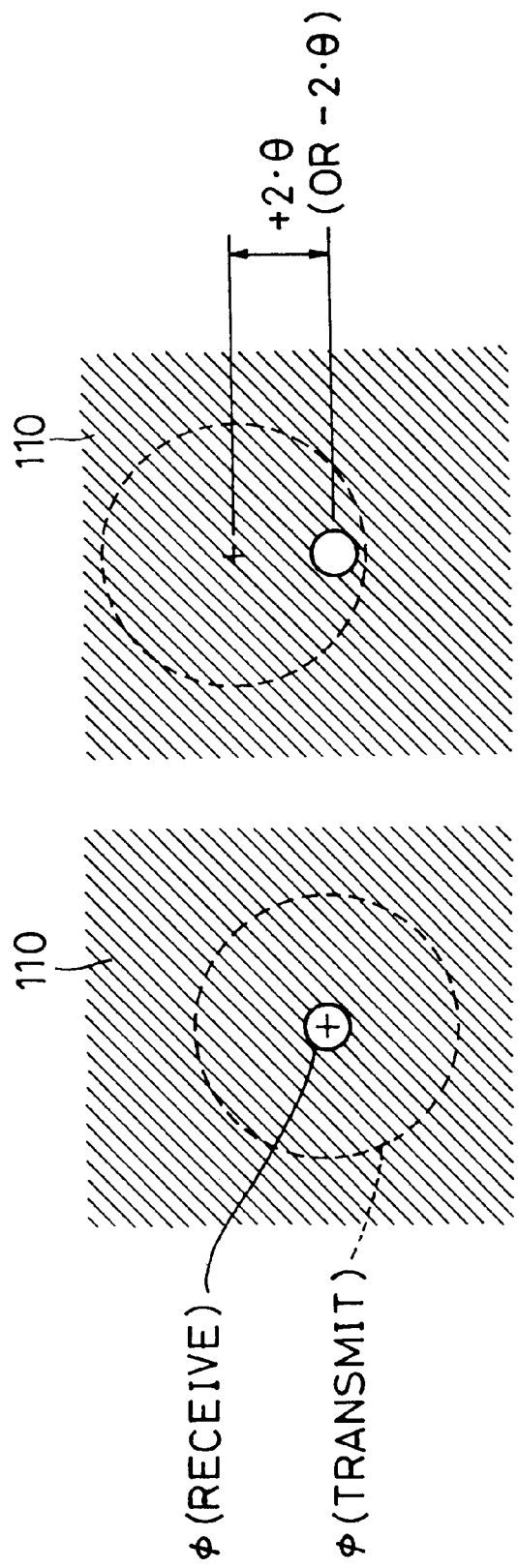

φTRANSMIT   φRECEIVE

FIG. 10
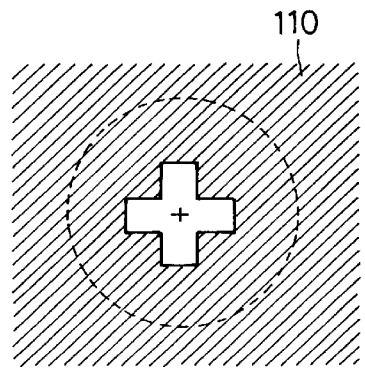
FIG. 11(A)    FIG. 11(B)
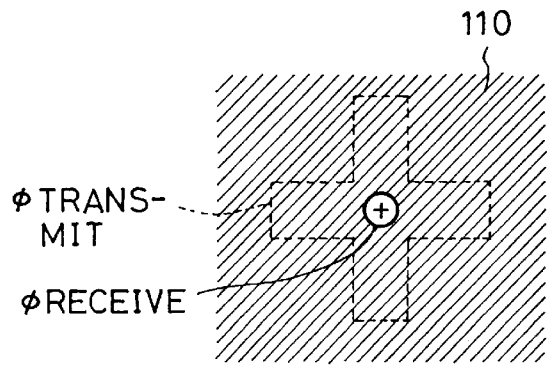
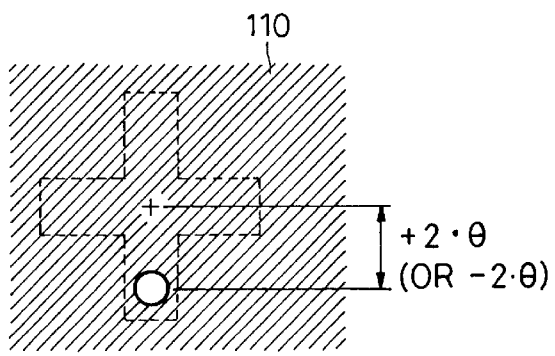

FIG. 12(A)
FIG. 12(B)
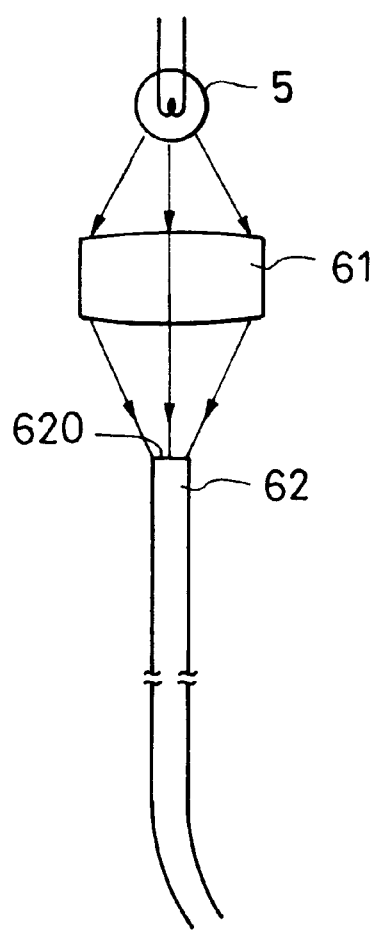
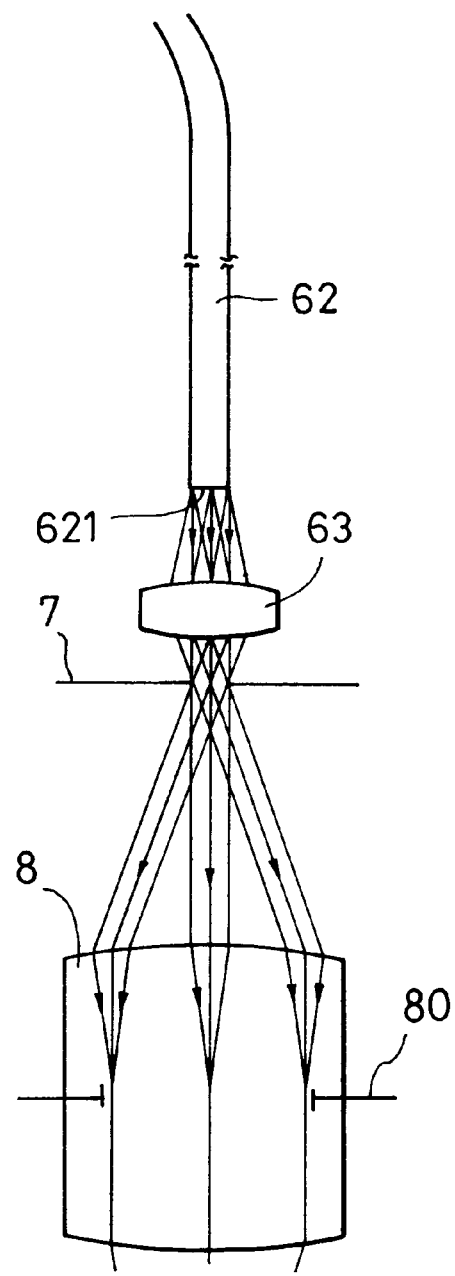

SURFACE POSITION DETECTION DEVICE

BACKGROUND OF THE INVENTION

1. Field of the Invention

The present invention relates to a focal point detection device for use in a projection aligner for semiconductor manufacturing, for transferring a circuit pattern onto a wafer.

2. Description of the Related Art

There are several known surface position detection devices for use in a projection aligner. For example, Japanese Unexamined Patent Publication No. 62-299716 (U.S. Pat. No. 4,748,333) discloses one height detection system that measures the center of an exposure area on a wafer. In another device disclosed in Japanese Unexamined Patent Publication No. 2-102518 filed by the applicant of the present invention, a plurality of height detection systems are provided on an exposure area on a wafer and based on a plurality pieces of height information, the inclination and height of the exposure area are calculated and adjusted.

As seen from these known systems, most of the present surface position detection devices employ a laser, an LED or the like as a light source.

Generally speaking, in an optical system, an image of a slit illuminated by a light source is obliquely directed to a wafer to be detected using a projection imaging optical system, the slit image reflected off the wafer is re-focused on a position detection element using a image receiving optical system, and the up and down movement of the wafer to be detected is measured in the form of motion of the slit image on the position detection element.

In the optical system, resist should be applied to the surface of the wafer to be detected to the extent that the wafer is flat enough to be considered as a mirror wafer. By setting the incident angle of incident light to be 70 degrees or greater, the reflectance at the flattened resist surface of the wafer is increased to measure the resist surface position of the wafer.

A wafer has a stepwise or uneven profile with a diversity of patterns thereon.

In an integrated circuit portion in a large scale integrated circuit (LSI) chip where fine patterns are formed, the applied resist fills and smoothes the unevenness of the patterns to the extent that the resist surface is made flat enough to be considered as an optical mirror surface.

However, a large step is formed in the vicinity of a scribe line between LSI chips, and the application of resist is still unable to sufficiently fill the notch of the step.

The surface of the applied resist in the vicinity of the scribe line thus suffers dents (or projections).

The resist surface of the wafer thus has both areas considered as an optical mirror surface and other areas having an uneven profile.

As already described, when a slit image is directed to a flat resist surface considered as a mirror surface, an incident light ray is reflected at a substantially constant angle of reflection, and an image receiving optical system finely re-focuses the slit image on a position detection element.

In contrast, when the slit image is directed to the uneven resist surface, the light ray is reflected in a direction different from that reflected from the flat resist surface, and becomes a deflected light ray.

When the reflected light ray is deflected to the image receive optical system, the reflected light ray flux is fully or partially shaded, presenting difficulty in focusing the slit image on the position detection element.

Specifically, the symmetry of the re-focused slit image is destroyed, or the slit image is entirely missing. As a result, detection or measurement accuracy may be degraded, or measurement itself may become impossible.

To cope with this problem, known surface position detection devices use an oversize projected slit image to decrease the ratio of the unevenness profile area to the flat area within the reflected slit image coverage over the wafer surface or use an elongated rectangular slit image that is projected at an orientation of 45 degrees relative to the LSI chips on the wafer so that the scribe line area having an unevenness profile is relatively small with respect to the entire area of the slit image. Thus, the degree of shading through the image receiving optical system is reduced.

However, the design of LSI circuitry changes the ratio of the unevenness profile area to the entire resist surface. Thus, there is a possibility that, depending on the process used to design the LSI circuitry, the above methods are still subject to detection accuracy degradation leading to detection failure.

SUMMARY OF THE INVENTION

Accordingly, it is an object of the present invention to provide a surface position detection device that resolves the above problem.

According to one aspect, the present invention which achieves this objective relates to a surface position detection device comprising illumination means, first and second imaging optical systems, photodetector means, and position detecting means. The illumination means illuminates an object. The first imaging optical system projects the image of the object onto a surface to be detected. The second imaging optical system for re-focuses the image of the object reflected from the surface to be detected. The photodetector means detects the image re-focused by the second imaging optical system. The position detecting means detects the position of the surface to be detected, based on a signal generated by the photodetector means. The first imaging optical system comprises a first aperture member defining the cone angle of a light ray flux projected onto the object, which is denoted as $\phi\text{TRANSMIT}$, and the second imaging optical system comprises a second aperture member defining the cone angle of the light ray flux reflected from the surface to be detected, and detected by the photodetector means, which is denoted as $\phi\text{RECEIVE}$. $\phi\text{TRANSMIT}$ is greater than $\phi\text{RECEIVE}$.

In addition, $\phi\text{TRANSMIT} \geq 4 \cdot |\theta| + \phi\text{RECEIVE}$, where $\theta$ is substantially in the range of 1 to 3 degrees. Also, $\phi\text{TRANSMIT}$ can equal $4 \cdot |\theta| + \phi\text{RECEIVE}$, where $\theta$ is substantially in the range of 1 to 3 degrees.

Moreover, $\phi\text{ILLUMINATE} \geq |\beta\text{TRANSMIT}| \cdot \phi\text{TRANSMIT}$, where $\phi\text{ILLUMINATE}$ represents the cone angle of a light ray flux with which the illumination means illuminating the object, and $\beta\text{TRANSMIT}$ represents the imaging magnification of the first imaging optical system.

The first imaging optical system obliquely projects the image of the object to the surface to be detected and the second imaging optical system directs the image of the object obliquely reflected from the surface to be detected onto the photodetector means. The first imaging optical system can be a telecentric optical system on the output side of the first imaging optical system facing the surface to be detected and the second imaging optical system is a telecentric optical system on the input side of the second imaging optical system facing the surface to be detected. In addition, the object can be optically conjugate with the surface to be detected and the surface to be detected can be optically conjugate with the pickup face of the photodetector means. Also, the illumination means can comprise means for causing the luminous intensity per unit cone angle within the cone angle of the light ray flux projected onto the object to be uniform. Also, the surface to be detected is a resist-coated surface of a wafer.

According to another aspect, the present invention which achieves this objective relates to a position detecting device comprising illuminating means, first and second imaging optical system, photodetector means, and position detecting means. The illuminating means illuminates an object. The first imaging optical system projects the image of the object onto a surface to be detected. The second imaging optical system re-focuses the image of the object reflected from the surface to be detected. The photodetector means detects the image re-focused by the second imaging optical system. The position detecting means detects the position of the surface to be detected, based on the signal generated by the photodetector means. The first imaging optical system comprises a first aperture member defining the cone angle of a light ray flux projected onto the object, which is denoted as φTRANSMIT. The second imaging optical system comprises a second aperture member defining the cone angle of a light ray flux reflected from the surface to be detected, and detected by the photodetector means, which is denoted as φRECEIVE. φTRANSMIT is less than φRECEIVE.

In addition, $4 \cdot |\theta| + \phi TRANSMIT \leq \phi RECEIVE$, where θ is substantially in the range of 1 to 3 degrees, or $4 \cdot |\theta| + \phi TRANSMIT = \phi RECEIVE$, where θ is substantially in the range of 1 to 3 degrees.

Moreover, in the embodiment, $\phi ILLUMINATE \geq \beta TRANSMIT | \cdot \phi TRANSMIT$, where φILLUMINATE represents the cone angle of a light ray flux with which the illumination means illuminates the object and βTRANSMIT represents the imaging magnification of the first imaging optical system.

The first imaging optical system can obliquely project the image of the object to the surface to be detected and the second imaging optical system can direct the image of the object obliquely reflected from the surface to be detected onto the photodetector means. In addition, the surface to be detected can be a resist-coated surface of a wafer.

The embodiments of the present invention will be more fully understood from the following detailed description of preferred embodiments of the invention taken in conjunction with the accompanying drawings.

BRIEF DESCRIPTION OF THE DRAWINGS

FIGS. 3A and 3B are diagrams showing the positional relationship between a transmit light ray flux and a receive light ray flux at the pupil position in the embodiment 1.

FIG. 10 is a schematic diagram showing the positional relationship between the transmit light ray flux and the receive light ray flux at the pupil position in another embodiment.

FIGS. 11A and 11B are schematic diagrams showing the positional relationship between the transmit light ray flux and the receive light ray flux at the pupil position in yet another embodiment.

FIGS. 12A and 12B are schematic diagrams showing the arrangement of the illumination means SA in yet another embodiment.

DESCRIPTION OF THE PREFERRED EMBODIMENTS Embodiment 1

Figure 1:
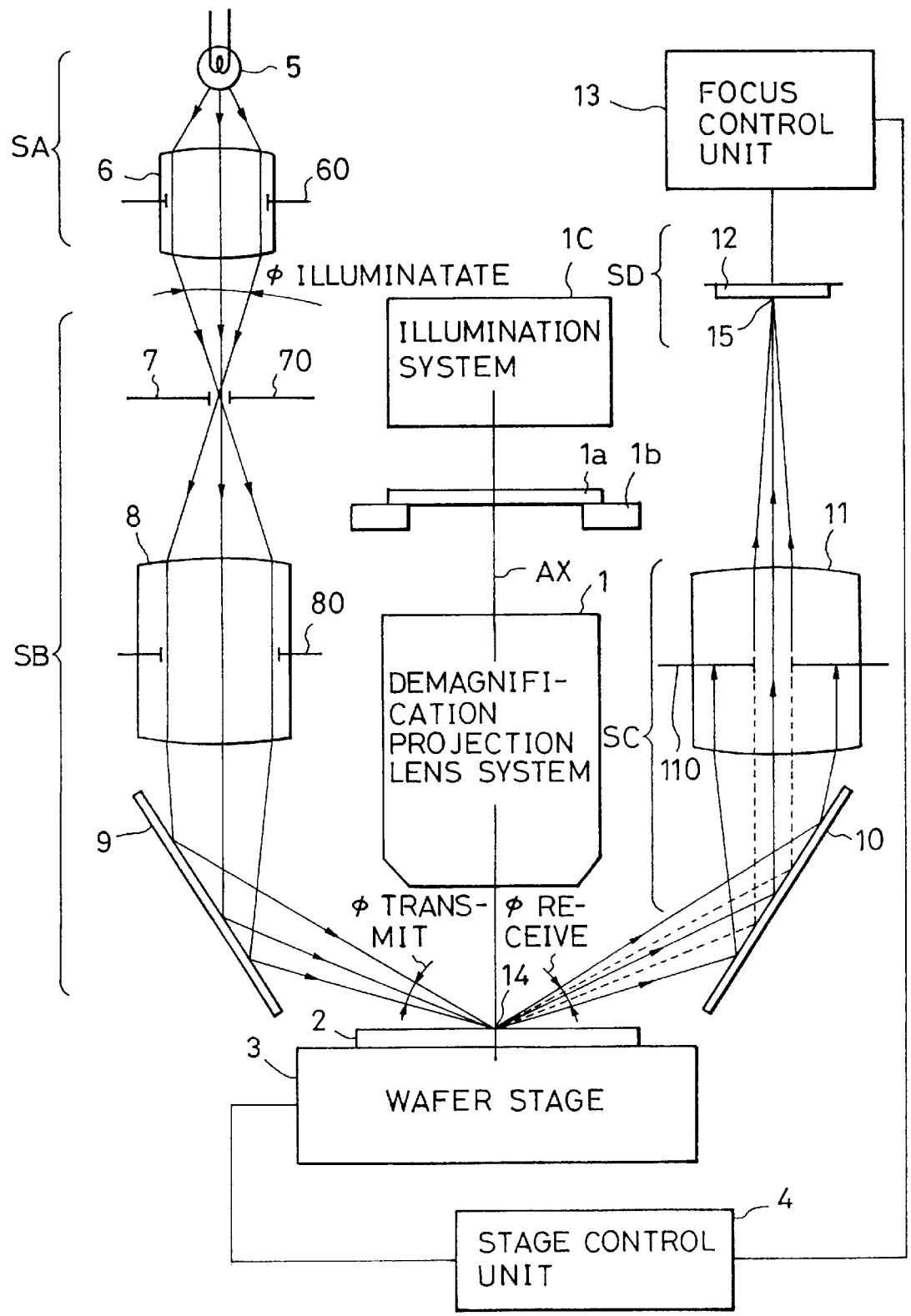
FIG. 1 is a block diagram showing embodiment 1 of the present invention.

FIG. 1 is the block diagram showing the projection aligner for semiconductor manufacturing equipped with the surface position detection device of the present invention.

As shown, a demagnification projection lens system 1 has an optical axis AX.

A reticle 1a has a circuit pattern formed thereon, and is mounted on a reticle stage 1b. An illumination system 1c illuminates uniformly the circuit pattern on the surface of the reticle 1a.

The projection lens system 1 demagnifies and projects the circuit pattern on the reticle 1a on a semiconductor wafer 2.

The wafer 2 is vacuum-fastened onto a wafer stage 3.

The wafer stage 3 is capable of moving and tilting the wafer 2 in the direction of the optical axis AX (z-direction) of the projection lens system 1, and in two mutually perpendicular directions (x- and y-directions) perpendicular to the z-direction.

A stage control unit 4 controls the translation and tilting of wafer stage 3 in x-, y- and z-directions.

The construction of the surface position detection device of the present invention is now discussed.

To control the position of the surface of the wafer 2, a surface position detection device is provided which comprises illumination means SA, image transmit means SB, image receiving means SC, and photoelectric conversion means SD. The illumination means SA and image transmit means SB constitute projection means SAB, and the image receiving means SC and photoelectric conversion means SD constitute detection means SCD.

Next, the surface position detection device is briefly discussed.

The projection means SAB lets the light ray flux projected through an aperture 70 of a slit section 7 to be projected onto the surface of the wafer 2, and forms a point of detection 14. The aperture 70 and the point of detection 14 are optically conjugate to each other.

The detection means SCD picks up, on a point of incidence 15 on a position detection element 12, the light ray flux reflected from the point of detection 14 on the wafer 2. In this case, the point of detection 14 and the point of incidence 15 on the position detection element 12 are optically conjugate to each other, and the image of the aperture 70 at the slit section 7 is re-focused on the point of incidence 15 on the position detection element 12.

The variation in the surface position (height) of the point of detection 14 in the direction of the optical axis AX corresponds to the variation in the position of the point of incidence 15 on the position detection element 12, and the variation in the position of the point of incidence 15 is detected from the output signal from the position detection element 12.

The output signal from the position detection element 12 is sent to a focus control unit 13 via a signal line. Variations in the position of the wafer stage 3 in x- and y-directions are measured using an unshown laser interferometer according to a known method, and a signal indicative of the position variation of the wafer stage 3 is sent from the laser interferometer to the stage control unit 4 via a signal line. The stage control unit 4 performs position control of the wafer stage 3 in x-y directions while performing translation and tilt control for the wafer stage 3 in the z-direction based on the signal coming in from the focus control unit 13 via a signal line.

The construction of the surface position detection device is discussed in detail.

The illumination means SA is made up of a light source 5 and an illumination optical system 6.

Light rays emitted from the light source enter the illumination optical system 6.

The illumination optical system 6 is provided with an aperture stop 60, which delimits the light ray flux that is going to illuminate the aperture 70 in the slit section 7 after passing the illumination optical system 6. The aperture stop 60 is preferably placed at the pupillary position of the illumination optical system 6.

Let φILLUMINATE represent the cone angle of the light ray flux that illuminates the aperture 70 in the slit section 7.

The image transmit means SB comprises the slit section 7 having the aperture 70, an image transmit optical system 8, a transmit aperture stop 80 and a mirror 9.

The light ray flux passing through the aperture 70 in the slit section 7 enters the image transmit optical system 8. The image transmit optical system 8 is provided with the transmit aperture stop 80, which delimits the light ray flux that is going to the point of detection 14 on the wafer 2. The transmit aperture stop 80 is preferably placed at the pupillary position of the image transmit optical system 8.

The light ray flux passing through the image transmit optical system 8 is reflected by the mirror 9 toward the point of detection 14 on the wafer 2 and is focused thereon as the image of the aperture 70 in the slit section 7.

Let φTRANSMIT represent the cone angle of the light ray flux incident on the point of detection 14 on the wafer 2.

The image receiving means SC comprises a mirror 10, an image receiving optical system 11, and a receiving aperture stop 110.

The light ray flux reflected off the point of detection 14 on the wafer 2 is reflected by the mirror 10 and enters the image receiving optical system 11. The image receiving optical system 11 houses the receiving aperture stop 110, which delimits the light ray flux that is going to enter the point of incidence 15 on the position detection element 12. The receiving aperture stop 110 is preferably placed at the pupillary position of the image receiving optical system 11.

A particular portion of the light ray flux which is reflected from the point of detection 14 on the wafer 2 and which is then selected through the receiving aperture stop 110 is re-focused as the image of the aperture 70 in the slit section 7 on the point of incidence 15 on the position detection element 12.

Let φRECEIVE represent the cone angle of the light ray flux reflected from the wafer 2 and then selected through the receiving aperture stop 110.

The photoelectric conversion means SD comprises the position detection element 12.

The position detection element 12 photoelectrically converts the optical image of the aperture 70 in the slit section 7 re-focused at the point of incidence 15 by the image receiving optical system 11, and gives an electrical signal output.

Let βTRANSMIT represent the imaging magnification of the image transmit means SB and θ represent an inclination angle of the resist surface of the wafer. The cone angles φILLUMINATE, φTRANSMIT and φRECEIVE are related as follows.

Let the transmit aperture (φTRANSMIT) transmitting light to the wafer be greater than the receive aperture (φRECEIVE) for receiving the light ray flux reflected from the wafer in view of the inclination angle (θ) of the resist surface. Our test results showed that the inclination angle θ ranges substantially from 1 degree to 3 degrees.

The relationship φTRANSMIT≧4·|θ|+(φRECEIVE) (θ=1–3 degrees) holds true.

Light rays from the illumination means SA passing the aperture 70 in the slit section 7 are set to fully cover the opening (|βTRANSMIT|·φTRANSMIT) of the image transmit means SB to the slit section 7 side. Thus, the following equation holds true.

φILLUMINATE≧|βTRANSMIT|·φTRANSMIT

Thus, (φILLUMINATE)/|βTRANSMIT|≧φTRANSMIT≧4·|θ|+(φRECEIVE)

With the luminous intensity level per unit cone angle within φILLUMINATE being uniform, a light ray flux having a cone angle of φRECEIVE has preferably a uniform luminous intensity level per the cone angle of φRECEIVE even if the light ray flux of φRECEIVE is set to be anywhere within the coverage of φTRANSMIT.

When the above relationship holds, the resist surface of the wafer to be detected, even if it is uneven, can be measured in the same manner as a flat resist surface that is considered as a mirror surface. The reason for this is discussed below.

Figure 2:
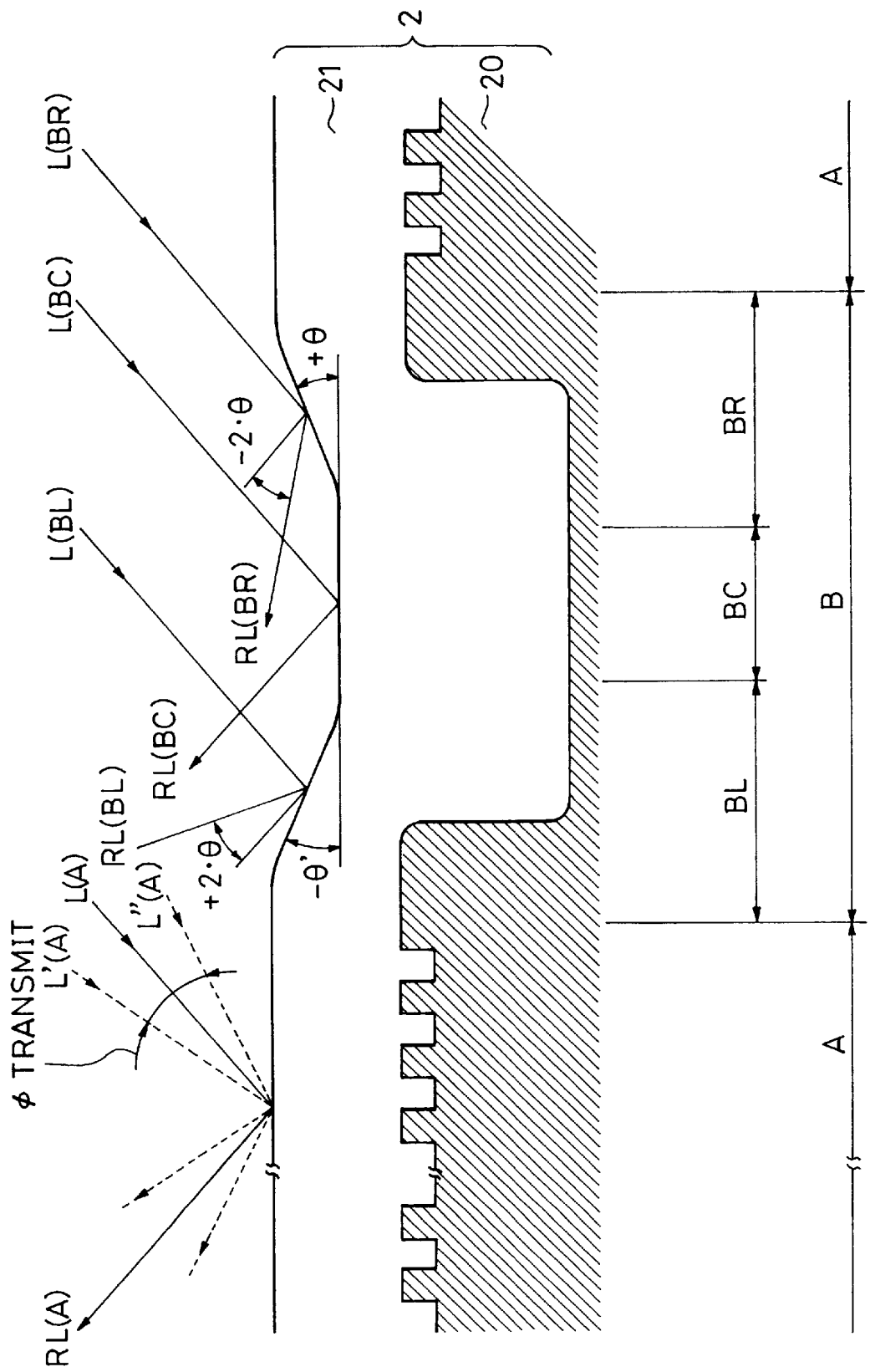
FIG. 2 is a cross-sectional view of a resist-coated wafer which is an object to be detected.

FIG. 2 shows the cross-section of a resist-coated wafer.

The wafer 2 is constructed of a patterned substrate wafer 20 with a coating of resist 21 applied thereon.

The pattern substrate wafer 20 has areas of a fine pattern forming a memory or the like (areas A) spatially alternating with scribe line areas (areas B).

Since the area A has a fine unevenness arising from the pattern, the application of resist flattens it, and thus the resulting resist surface is regarded as an optically mirrored surface.

The area B is in the vicinity of the scribe line, and the surface of the resist applied therein is recessed.

The area B is now considered by dividing it into a portion BL sloped downward to the right in FIG. 2, a portion BC that is level, and a portion BR sloped upward to the right in FIG. 2.

Let −θ and +θ represent the inclinations of the portions BL and BR, respectively in FIG. 2.

Now suppose that the slit image is projected on the areas A and B.

Light ray fluxes projected onto the wafer are represented by solid lines with arrows L(A), L(BL), L(BC) and L(BR) in FIG. 2.

L(A) is the principal light ray centered on the cone angle φTRANSMIT defined by dotted lines with arrows L'(A) and L"(A), and light rays between L'(A) and L"(A) are substantially converged at the point of reflection on the wafer to form part of the slit image.

L(BL), L(BC) and L(BR) are also principal light rays with their respective cone angles φTRANSMIT, and are substantially converged at the respective points of reflection to focus the slit image. The light rays L(A) and L(BC) are reflected at an equal angle from the areas A and B, respectively, as light rays RL(A) and RL(BC) as shown in FIG. 2.

The light rays RL(BL) and RL(BR) that are reflected light rays from the portions BL and BR having inclinations with respect to the resist surface have angles of reflection deflected from the reflected light rays RL(A) and RL(BC) as shown in FIG. 2.

Since the portions BL and BR are inclined at angles of −θ and +θ with respect to the resist surface, the deflection angles of the reflected light rays RL(BL) and RL(BR) are +2θ and −2θ, respectively.

As already described, our test results showed that the magnitude of the inclination angle θ ranges substantially from 1 degree to 3 degrees.

In accordance with the inclination θ, the receiving aperture φRECEIVE (and φTRANSMIT as well) has been conventionally set to be from 2 degrees to 4 degrees, in view of a setting of incident angle of 70 degrees or greater in the focal point detection device of an oblique incidence optical system and in order to achieve a large permissible focal depth in the image receive optical system.

FIGS. 3A and 3B show the positional relationship of the receiving aperture stop 110 with the receiving light ray flux reflected from the areas of the wafer 2 in FIG. 2 and received by the image receiving optical system 11.

As shown, the hatched area represents the receiving aperture stop 110, with openings being defined by a solid line having the cone angle φRECEIVE. Circles defined by a dotted line represent the transmitting light ray flux in each of the areas of the wafer, having the cone angle of φTRANSMIT.

The crosshair in the center of each of the dotted circles shows the point of incidence of the principal transmit light ray of the transmit flux.

FIG. 3A shows the position of the flux reflected from the areas A and BC, which are level surfaces.

The position of the reflected principal light rays RL(A) and RL(BC), denoted by the crosshair, coincides with the center of the receiving aperture stop 110, and the light rays of the central portion of the transmit flux having cone angle of φTRANSMIT defined by the dotted line enter the position detection element 12, which re-focuses the image of the aperture 70 in the slit section 7.

FIG. 3B shows the position of the transmit flux reflected from the inclined portion BL (or BR).

The position of the principal light ray RL(BL) (or RL(BR)) of the reflected flux, denoted by the crosshair, is spaced apart from the aperture center of the receiving aperture stop 110 by +2θ (or −2θ), and the light rays of the peripheral portion of the transmit flux having the cone angle of φTRANSMIT defined by the dotted line enter the position detection element 12, which re-focuses the image of the aperture 70 in the slit section 7.

Figure 4B:
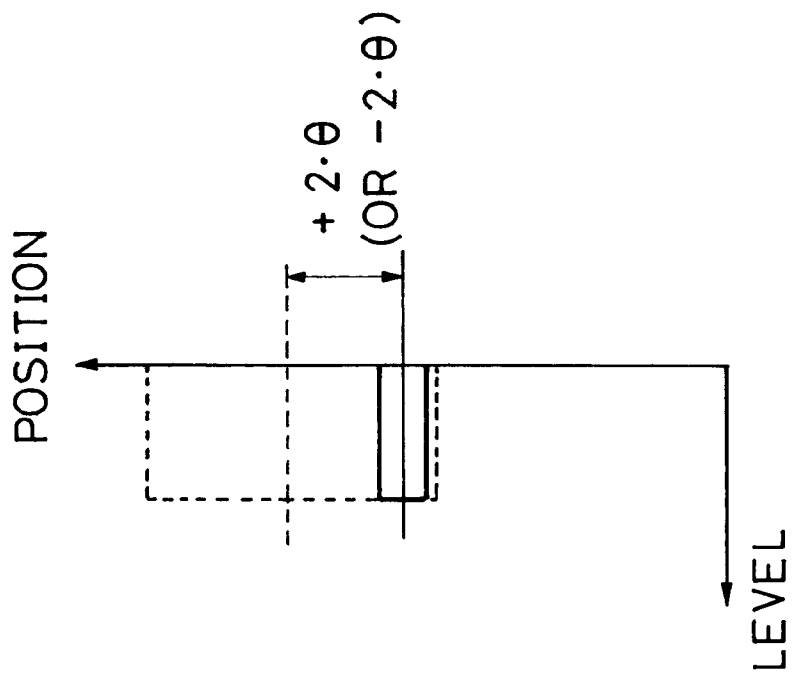
FIGS. 4A and 4B plot the transmit light ray flux and the receive light ray flux in the position versus luminous intensity level plot at the pupil position in the embodiment 1.
Figure 4A:
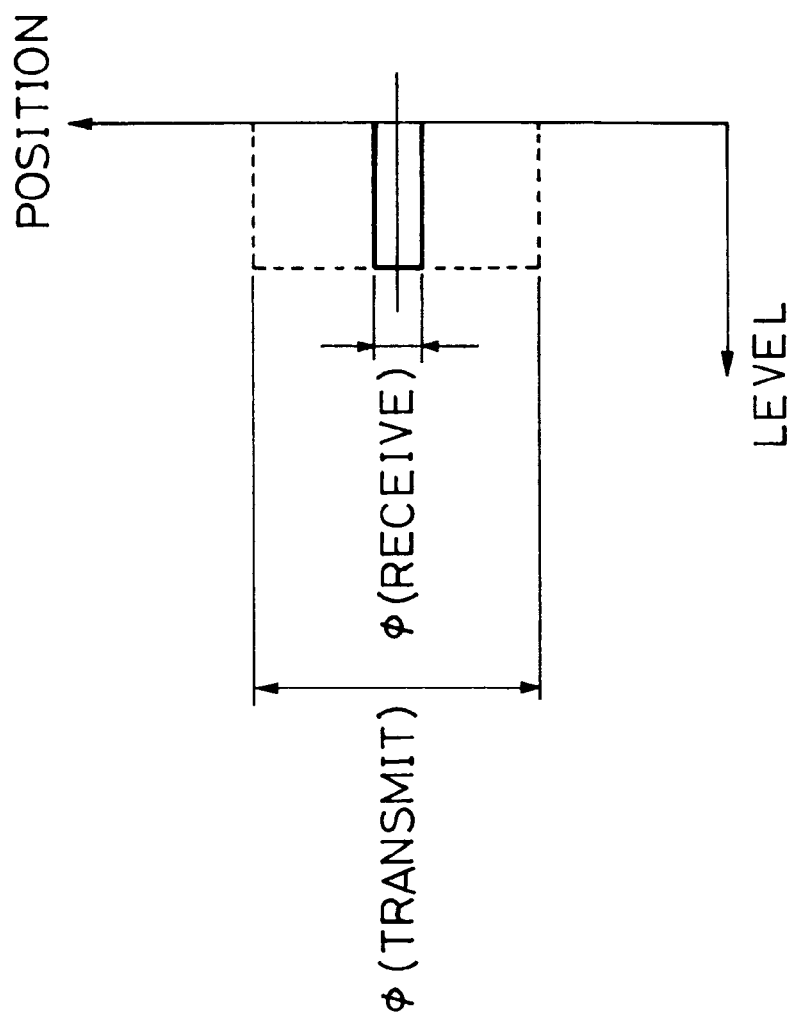

In FIGS. 4A and 4B, the ordinate represents position within the receiving aperture stop 110, and the abscissa represents luminous intensity level.

FIGS. 4A and 4B show the luminous intensity level of the reflected fluxes corresponding to FIGS. 3A and 3B respectively. The luminous intensity level of the reflected flux from each of the areas of the wafer 2 is represented by the dotted line, and the luminous intensity level of the reflected flux that has passed through the receiving aperture stop 110 is represented by the solid line.

In both FIGS. 4A and 4B, the integral values of the luminous intensity level of the reflected flux that has passed through the receiving aperture stop 110 are equal to each other, although the center of the reflected flux is spaced a distance +2θ or −2θ from the center of the receiving aperture step 110 in FIG. 4B.

In FIGS. 4A and 4B, the luminous intensity within the cone angle φTRANSMIT is plotted at a constant level. In practice, however, the luminous intensity level is not ideally flat because diffracted light of zero or a higher order emitted from the aperture 70 in the slit section 7 are distributed within the coverage of the cone angle of φTRANSMIT.

Suppose that a flux of cone angle of φRECEIVE that has passed through the receiving aperture stop 110 is now taken from within the cone angle of φTRANSMIT at an arbitrary angle. The luminous intensity level within the coverage of cone angle of φTRANSMIT is regarded as uniform when the luminous intensity level per each cone angle of φRECEIVE is uniform.

Figure 5:
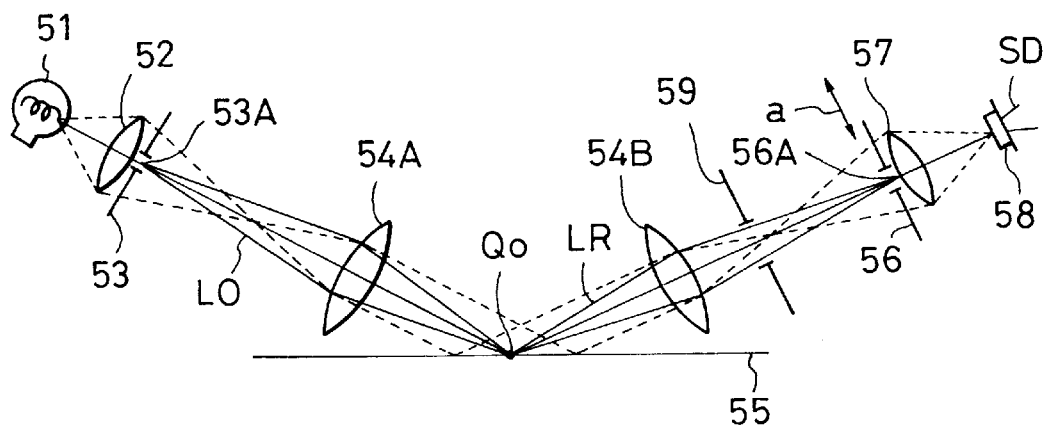
FIG. 5 is a diagrammatic view of the related art.

FIG. 5 shows the arrangement of the known focal point detection device.

As shown, LO and LR indicated by the solid lines represent fluxes focusing the image of a slit section 53, and dotted lines indicate conjugate relationships.

The functions of the components herein are listed below. The image of an aperture 53A in a slit section 53 is focused at a point of detection QO on a wafer 55, and is re-focused in an aperture 56A of a vibration slit section 56. The position of the re-focused image of the slit 53 in the vibration slit section 56 is measured.

Figure 6:
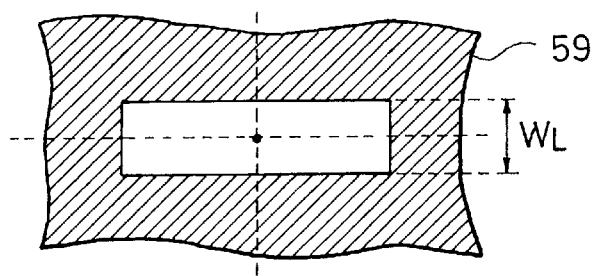
FIG. 6 shows a known aperture stop.

A receiving aperture stop 59 is rectangular as shown in FIG. 6.

The permissible focal depth of a lens 54B is increased by narrowing the width, WL, of the rectangular aperture stop 59, shown in FIG. 6, in the plane of the stop 59 as in FIG. 5.

The cone angle of φTRANSMIT incident to the point of detection QO on the wafer 55 is delimited by the periphery of a lens 54A, because image transmit means SB has no aperture stop therewithin.

Illumination means SA: light source 51, lens 52
Image transmit means SB: slit section 53 (aperture 53A), lens 54A
Image receiving means SC: lens 54B, receiving aperture stop 59
Photoelectric
conversion means SD: vibration slit section 56 (aperture 56A), lens 57, photoelectric conversion element 58

Figures 7A, 7B:
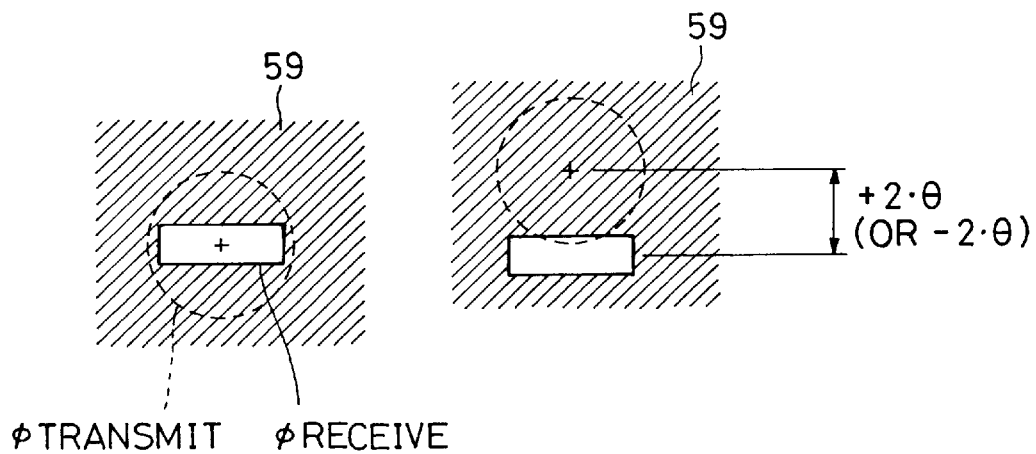
FIGS. 7A and 7B are schematic diagrams showing the positional relationship between a transmit light ray flux and a receive light ray flux at the pupil position in the related art.

FIGS. 7A and 7B show the positional relationship of the receiving aperture stop 59 with the transmit flux reflected from each of the areas on the wafer 2 shown in FIG. 2 and received by the lens 54B as the image receiving means SC when the wafer 2 in FIG. 2 is measured using the focal point detection device in FIG. 5.

FIG. 7A shows the position of the transmit flux reflected by the level areas A and BC.

The position of the reflected principal light rays RL(A) and RL(BC), denoted by the crosshair, coincides with the center of the receiving aperture stop 59, and the transmit flux having cone angle of φTRANSMIT defined by the dotted line entirely covers the receiving aperture stop 59. The flux that has passed through the receiving aperture stop 59 focuses the image of the aperture 53A in the slit section 53 in the vibration slit section 56 that is part of the photoelectric conversion means SD.

FIG. 7B shows the position of the transmit flux reflected from the inclined portion BL (or BR).

The position of the principal light ray RL(BL) (or RL(BR)) of the reflected flux, denoted by the crosshair, is spaced apart from the aperture center of the receive aperture stop 59 by +2θ (or −2θ), and the peripheral portion of the transmit flux having the cone angle of φTRANSMIT defined by the dotted line covers part of the receive aperture stop 59. The flux that has passed through the receive aperture stop 59 focuses the image of the aperture 53A in the slit section 53 in the vibration slit 56 that is part of the photoelectric conversion means SD.

Figure 8B:
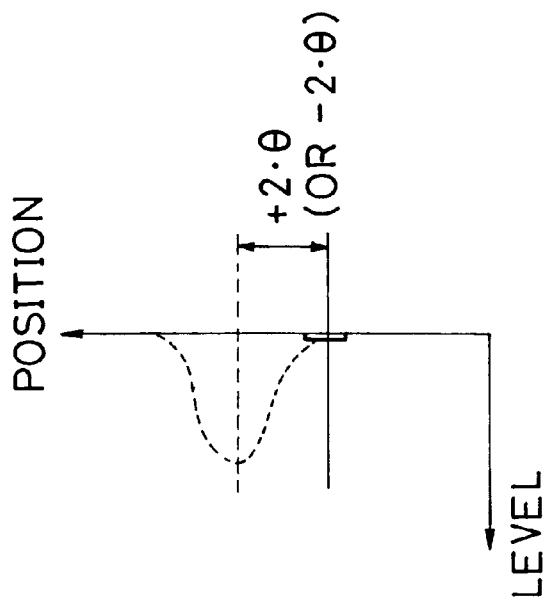
FIGS. 8A and 8B plot the transmit light ray flux and the receive light ray flux in a position versus luminous intensity level graph at the pupil position in the related art.
Figure 8A:
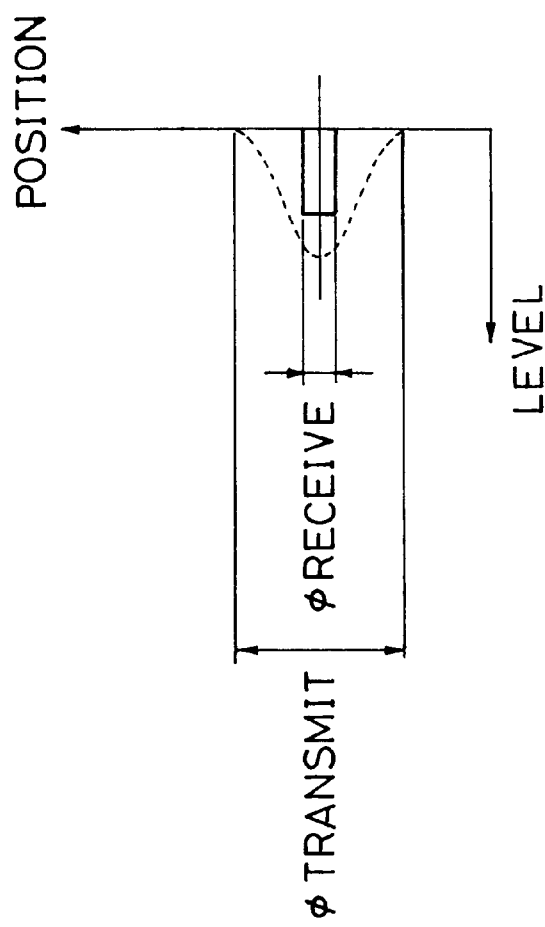

In FIGS. 8A and 8B, the ordinate represents the position within the receiving aperture stop 59, and the abscissa represents the luminous intensity level.

FIGS. 8A and 8B show the luminous intensity level of the reflected fluxes corresponding to FIGS. 7A and 7B. The luminous intensity distribution of the flux reflected from each of the areas of the wafer 2 and received by the lens 54B is represented by the dotted line, and the intensity distribution of the reflected flux that has passed through the receiving aperture stop 59 is represented by a solid line. According to the arrangement in FIG. 5, the image of the light source 51 is focused on the plane of the pupil of the receiving aperture stop 59, and the intensity distribution of the light source 51 is directly reflected in the plot of the luminous intensity distribution within φTRANSMIT with its peak appearing in the middle of the plot.

In contrast to FIG. 8A, the integral value of intensity of the transmit flux that has passed through the receiving aperture stop 59 is minimal in FIG. 8B, because of the following two reasons: 1) a fraction of the transmit flux passes through the receiving aperture stop 59 since the peak intensity occurs at a distance +2θ or −2θ from the center of the receiving aperture stop 59, and 2) the intensity level is low at the peripheral portion of the intensity distribution of the transmit flux.

FIG. 9 shows the luminous intensity distribution 140 of the slit image focused on the wafer 2 by the image transmit means SB, and the luminous intensity distributions 150, 151 of the slit image re-focused by the image receiving means SC.

Figure 9A:
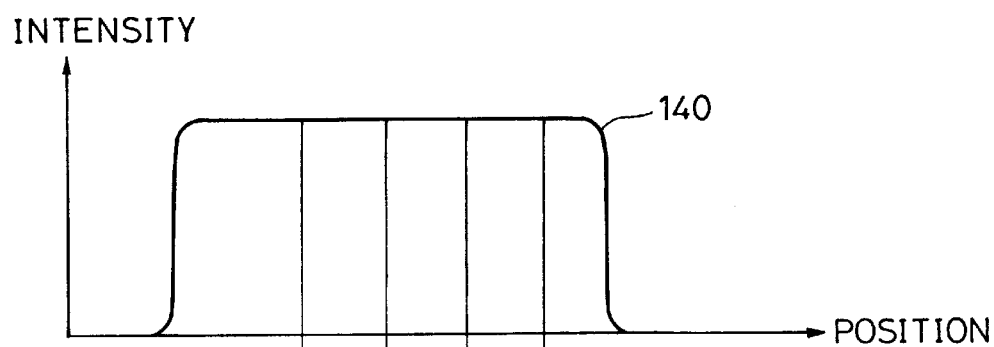
FIG. 9A shows the light intensity distribution of a slit image projected onto a wafer 2.

FIG. 9A shows the luminous intensity distribution 140 of the slit image when the wafer 2 is measured by both the focal point detection device of the present invention shown in FIG. 1 and the known focal point detection device shown in FIG. 5 with the image of the identically shaped slit focused on the wafer 2.

Figure 9B:
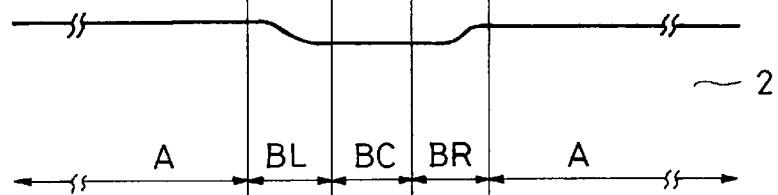
FIG. 9B is a cross-sectional view of the wafer 2 at the position of reflection of the slit image.

FIG. 9B is a cross-sectional view of the unevenness profile of the resist surface of the wafer 2 from which the projected image of the slit is reflected, and the description of the unevenness profile in FIG. 2 equally applies to this figure. The same reference letters used in FIG. 2 denote the same elements.

Figure 9C:
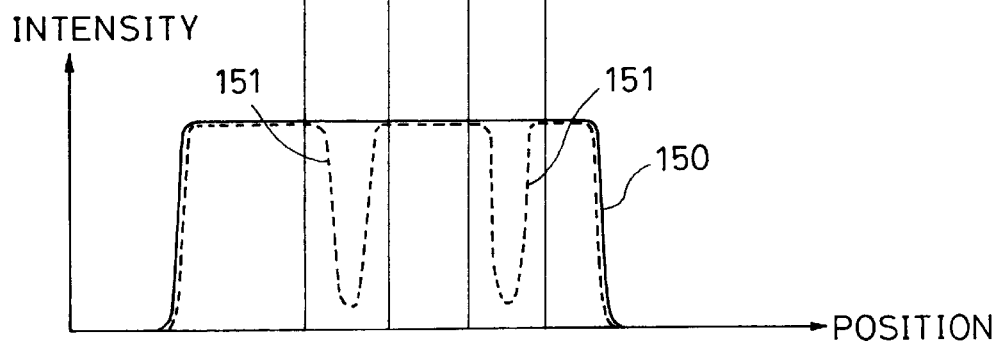
FIG. 9C shows the light intensity distribution of the slit image that is re-focused on a position detection element 12.

FIG. 9C shows the intensity distribution 150 of the slit image, in a solid line, focused by the image receiving means SC of the present invention in FIG. 1. In response to light rays from the flat areas A and BC, and areas BL and BR that deflect the angle of reflection, the intensity of light that passes through the receiving aperture stop 110 remains equal as indicated in FIGS. 4A and 4B. The luminous intensity distribution 150 of the slit image that is re-focused is flat regardless of the point of reflection on the wafer 2.

The intensity distribution 151 of the slit image re-focused by the known image receive means SC shown in FIG. 5 is represented by the dotted line. As shown in FIGS. 8A and 8B, the luminous intensity of light that passes through the receiving aperture stop 59 is substantially decreased because of shading when the light rays are reflected from the portions BL and BR which deflect the angle of reflection due to their inclination. The level at the intensity distribution 151 of the re-focused slit image is substantially decreased on the portions BL and BR on the wafer 2, thereby splitting the light of the slit image, making the slit image laterally asymmetrical.

The optical focal point detection device determines the central position of the slit image and height of the object to be detected, based on the luminous intensity distribution of the re-focused slit image.

If the height of the object to be detected is calculated, based on the luminous intensity distribution 151 of the asymmetrical slit image shown by the dotted line in FIG. 9C, a detection error occurs, depending on the surface unevenness of the object and in extreme cases, the luminous intensity level of the slit image is decreased such that height detection is impossible to perform.

The focal point detection device of the present invention produces the luminous intensity distribution 150 of the slit image in a reliable manner regardless of the surface unevenness of the object to be detected.

According to the embodiment in FIG. 1, the permissible focal depth of the image receiving means SC is increased by sizing the receive aperture φRECEIVE of the image receive means SC to be smaller than the transmit aperture φTRANSMIT of the image transmit means SB. This arrangement provides an optical focal point detection device with a wide-range detection capability.

Embodiment 2

In the semiconductor manufacturing of wafer 2, its flatness is strictly controlled. With the wafer 2 mounted on the projection aligner for semiconductor manufacturing as shown in FIG. 1, the angle of taper due to variations in the flatness of the entire wafer surface is as small as a few hundred ppm, and is negligibly small compared with the already described inclinations (θ) of the resist surface.

If the taper angle (ψ) of the surface to be detected, arising from variations in the flatness of the wafer surface, is too large to be neglected, the already described conditions may be modified as follows:

$$\phi\text{TRANSMIT} \geq 4 \cdot (|\theta| + |\psi|) + (\phi\text{RECEIVE})$$

Thus, $$(\phi\text{ILLUMINATE})/|\beta\text{TRANSMIT}| \geq \phi\text{TRANSMIT}$$

Embodiment 3

In the focal point detection device in FIG. 1, the receiving aperture stop 110 of the image receiving means SC is preferably small-sized to increase the permissible focal depth in the vicinity of the point of reflection on the wafer 2 as the object to be detected, and thereby to widen the range of detection for the object to be detected.

The size of the cone angle φRECEIVE determined by the receiving aperture stop 110 of the image receiving means SC is large enough to pick up at least +1st and -1st order diffraction light rays required to focus the image of the aperture 70 out of the diffraction light rays emitted from the aperture 70 in the slit section 7.

In FIGS. 3A and 3B, the receiving aperture stop 110 of the image receiving means SC is cylindrical. Depending on the shape of the aperture 70 in the slit section 7 for projection, the direction of and the angles at which ±1st order diffraction light rays are emitted differ with direction. In view of this, the receiving aperture stop 110 may be shaped to have a shape as shown in FIG. 10. The crosshair in this figure denotes the position of the light rays reflected by the wafer 2 at the point of detection 14 and incident on receiving aperture stop 110.

Embodiment 4

In FIGS. 3A and 3B, the transmit aperture stop 80 of the image transmit means SB has a circular shape when viewed in cross-section. In many cases, patterns and scribe lines formed on the wafer 2 are typically directional with their horizontally and vertically running lines crossing mutually. Deviation of the reflected light rays is often directional, as well.

In this case, as shown in FIGS. 11A and 11B, the transmit aperture stop 80 of the image transmit means SB has a cross shape when viewed in cross-section, and represents the cone angle φTRANSMIT, the circle represents the opening in the receiving aperture stop 110, the position of the reflected principal light rays RL(A) and RL(BC), denoted by the crosshair in FIG. 11A, coincides with the center of the receiving aperture stop 110, the position of the principal light ray RL(BL) (or RL(BR)) of the reflected flux, denoted by the crosshair in FIG. 11B, is spaced from the aperture center of the receiving aperture stop 110 by +2θ (or -2θ), and the direction of deviation of the reflected light rays satisfies the condition φTRANSMIT≧4·(|θ|)+(φRECEIVE) (θ=1–3 degrees) in FIG. 11A or φTRANSMIT≧4·(|θ|+|ψ|)+ (φRECEIVE) in FIG. 11B.

Embodiment 5

It is required that the illumination means SA in FIG. 1 offer a uniform luminous intensity distribution within the luminous flux φILLUMINATE that illuminates the aperture 70 in the slit section 7, and the relationship of the light source 5 with the aperture 70 is either in critical illumination (defining an imaging relationship) or in Koehler illumination (defining the relationship between the image and pupil).

The illumination means SA may include uniform intensity producing means, though not shown in FIG. 1, such as a diffuser or a compound-eye lens, for producing a uniform luminous intensity distribution within the illuminating luminous flux.

As the uniform intensity producing means, an optical fiber may be used. The use of an optical fiber allows the image transmit means SB and the detection means SCD to be remotely placed from the light source 5, which can be a heat source, while permitting an increased degree of flexibility in design.

Referring to FIGS. 12A and 12B, the illumination means SA comprises the light source 5, a collector optical system 61, optical fiber 62, and a lens system 63. In these figures the same reference numerals as those used in FIG. 1 denote identical elements.

FIG. 12A shows the input portion of an optical fiber. The luminous flux emitted from the light source 5 is collected at the input end of an optical fiber 620 by the collector optical system 61, and enters the optical fiber 62.

FIG. 12B shows the output portion of the optical fiber. The luminous flux that has travelled through the optical fiber 62 is projected out through the output end 621 of the optical fiber, and illuminates the aperture 70 in the slit section 7 after passing through the lens system 63. The luminous flux that has passed through the aperture 70 reaches the transmit aperture stop 80 in the image transmit optical system 8.

This embodiment is characterized in that the image at the output end 621 of the optical fiber is focused at the image transmit aperture stop 80 in the image transmit optical system 8. The output end 621 of the optical fiber, if considered as a secondary light source, is in Koehler illumination (defining the relationship between the image and a pupil) with respect to the aperture 70 in the slit section 7.

In FIG. 12B, the diameter of the output end 621 of the optical fiber corresponds to the aperture stop 60 in the illumination optical system 6.

The optical fiber 62 may be a single-core fiber, or a bundle of a plurality of fibers.

Even if the luminous intensity distribution collected at the input end 620 of the optical fiber 62 in FIG. 12A is not uniform, the single-core fiber presents a uniform luminous intensity distribution at the output end 621 of the optical fiber 62 shown in FIG. 12B through repeated internal reflections within the optical fiber.

Since the image at the output end 621 of the optical fiber is focused at the transmit aperture stop 80 in the image transmit optical system 8, the luminous intensity distribution within the transmit aperture stop 80 is rendered uniform.

If a bundle of fibers is used, the number of cores is set to be sufficiently large to produce a uniform luminous intensity distribution within transmit aperture stop 80 and at the output end 621 of the optical fiber 62. The layout of the fibers at the input end 620 shown in FIG. 12A and the layout of the fibers at the output end 621 shown in FIG. 12B are set to be random. Thus, even if the luminous intensity distribution collected the input end 620 is not uniform, it is rendered uniform at the output end 621.

Embodiment 6

For simplicity, the embodiment shown in FIG. 1 has been described in connection with the focal point detection device that has a single point of detection on the wafer. The focal point detection device of the present invention may be of a type disclosed by U.S. Pat. No. 5,118,957 filed by the applicant of this invention, wherein a plurality of different points of detection are set up within an exposure area on a wafer.

The above described relationships between $\phi$RECEIVE, $\phi$TRANSMIT, and $\phi$ILLUMINATE are established with respect to each of the plurality of points set up within the exposure area on the wafer.

Embodiment 7

The focal point detection device with a single point of detection or a plurality of points of detection on the exposure area on the wafer has to satisfy the following relationship when the width of the aperture 70 in the slit section 7 for projection is large.

Now suppose that the image transmit means SB provides Scheimpflug's condition between the plane of the aperture 70 in the slit section 7 and the surface to be detected on which the image of the aperture 70 is focused, namely the plane in which the wafer 2 exists.

By Scheimpflug's condition is meant that the image plane of the aperture 70 is set to be in a swings-and-tilts position in relation to the image transmit means SB by arranging the plane of the aperture 70 in the slit section 7 in a swings-and-tilts position in relation to the image transmit means SB. Thus, the image plane for the aperture 70 and the plane of the surface of the wafer 2 to be detected are thus put into agreement.

Similarly, suppose that the image receive means SC provides Scheimpflug's condition between the plane of the surface of the wafer 2 to be detected and the plane of the pickup face of the position detection element 12.

Both the plane of the surface of the wafer 2 to be detected and the plane of the pickup face of the position detection element 12 are arranged in a swings-and-tilts position with respect to the image receive means SC, and thereby, both planes are set to be optically conjugate to each other.

Figure 13:
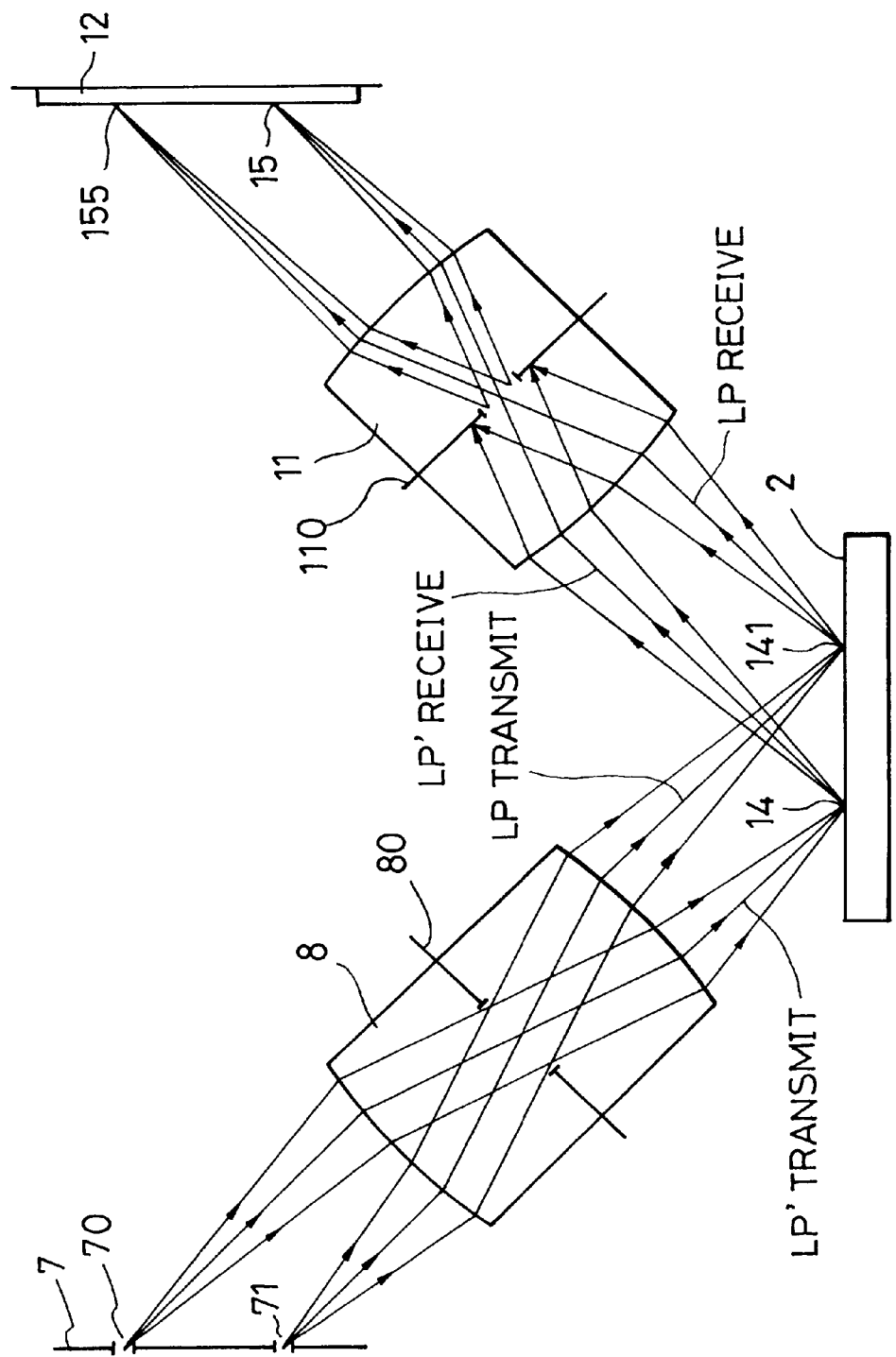
FIG. 13 is a schematic diagram showing the conjugate relationship in the focal point detection mechanism that makes measurements at a plurality of different points within an exposure area on the wafer in yet another embodiment.

FIG. 13 shows this optically conjugate relationship. In this figure the same reference numerals as those used in FIG. 1 denote identical or similar elements.

The slit section 7 has apertures 70, 71. The images of the apertures 70, 71 are focused at the point of detections 14, 141, respectively, on the surface of the wafer 2 to be detected. The images of the apertures 70, 71 are re-focused on points of pickup 15, 155 on the pickup face of the position detection element 12.

As for the illumination means SA, though not shown in FIG. 13, the apertures 70, 71 in the slit section 7 may share the same illumination means SA, or be illuminated individually by respective illumination means SA.

In FIG. 13, the same position detection element 12 is used to focus the images at the pickup points 15, 155. Alternatively, the pickup points 15, 155 are individually provided with respective position detection elements.

Both the image transmit means SB and image receiving means SC are preferably telecentric optical systems, at least to the side of the wafer 2 to be detected.

Preferably, the image transmit means SB is at least telecentric on its output side and the image receiving means SC is at least telecentric on its input side.

Principal light rays LP TRANSMIT and LP' TRANSMIT of the incident flux at the points of detection 14, 141 in FIG. 13 are made parallel by making the optical systems telecentric to the side of the wafer 2 to be detected. Parallel light rays LP TRANSMIT, LP' TRANSMIT and thus parallel light rays LP RECEIVE, LP' RECEIVE allow the incident angles at each detection point to be identical, and the pickup angles of the reflected flux to be identical.

Let $\beta$TRANSMIT (14), $\beta$TRANSMIT (141), $\beta$RECEIVE (14) and $\beta$RECEIVE (141) represent the imaging magnifications of the image transmit means SB and image receive means SC at the points of detection 14, 141. The following relationships hold true:

$\beta$TRANSMIT (14)=$\beta$TRANSMIT (141), and $\beta$RECEIVE (14)=$\beta$RECEIVE (141)

Generally speaking, an oblique incidence imaging optical system presents different imaging magnifications on different points of detection, 14 and 141 on the wafer 2.

For this reason, the image transmit means SB includes a compensation optical system, though not shown in FIG. 13, as disclosed in U.S. Pat. No. 5,118,957 filed by the applicant of the present invention. The compensation optical system individually compensates for imaging magnification in each of the optical paths for the detection points to establish the condition, $\beta$TRANSMIT (14)=$\beta$TRANSMIT (141). Similarly, the image receive means SC includes a compensation optical system, though not shown in FIG. 13, which individually compensates for imaging magnification in each of the optical paths for the detection points to establish the condition, $\beta$RECEIVE (14)=$\beta$RECEIVE (141).

By equalizing the imaging magnifications at two different detection points 14, 141 on the wafer 2, the different detection points have an identical detection accuracy.

Embodiment 8

The oblique incidence focal point detection device in FIG. 1 has been described. The present invention, however, also works in a normal incidence optical system.

Figure 14:
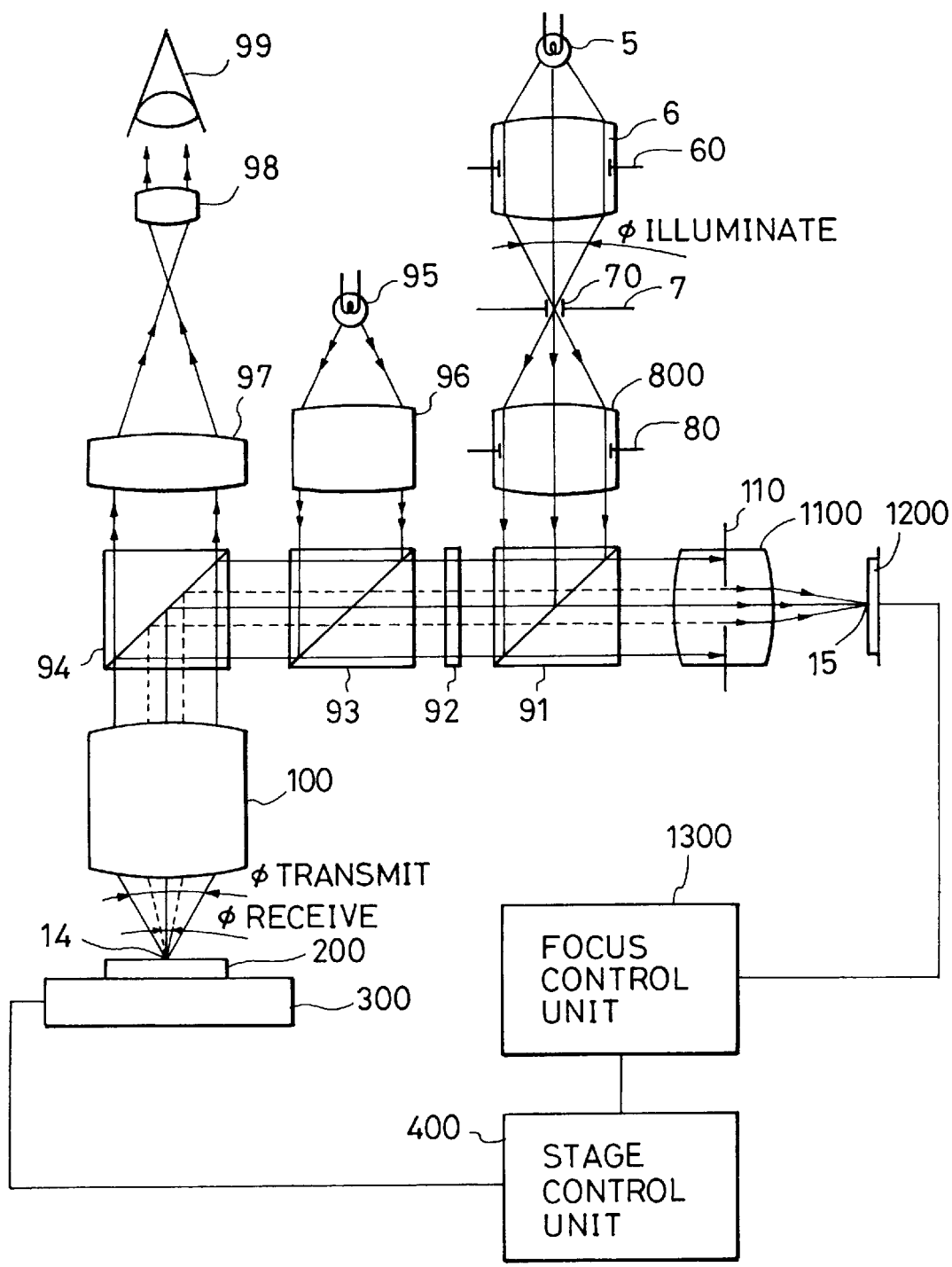
FIG. 14 is a schematic diagram showing yet another embodiment, in which the present invention is incorporated in a normal incidence optical system.

FIG. 14 shows an optical microscope in which the focal point detection device of the present invention is incorporated. Identical reference numerals used in FIGS. 1 and 14 denote identical elements.

The construction of the optical microscope is discussed referring to FIG. 14.

Light rays emitted from a light source 95 are rendered nearly parallel through a collimator 96, and then are reflected toward an objective lens 100 by beam splitters 93, 94.

The light source 95 emits light rays in the visible wavelength range. The beam splitter 93 is light-reflective only to the visible light rays, and the beam splitter 94 exhibits half mirror characteristic to the visible light rays.

Light rays that have passed through the objective lens 100 are converged in the vicinity of its focal point to illuminate a specimen 200 to be detected.

The light rays reflected from the specimen 200 to be detected pass through and are rendered parallel by the objective lens 100, then pass through the beam splitter 94 and a relay lens 97, and are focused to form the image of the specimen in the air. The light rays then reach an eyepiece 98 and enter an eye 99. The eye 99 thus observes an enlarged image of the specimen 200.

The construction of the focal point detection device of the present invention is now discussed more in detail.

The illumination means SA comprises the light source 5 and the illumination optical system 6 having the aperture stop 60.

The light source 5 now emits light rays in the invisible wavelength range, for example, infrared light rays. The rest of the operation of the illumination means SA remains unchanged from previous embodiments.

The image transmit means SB comprises the slit section 7 having the aperture 70, an image transmit optical system 800 having a transmit aperture stop 80, a polarization beam splitter 91, a $\lambda/4$ plate 92, beam splitters 93, 94, and the objective lens 100.

The light rays that have passed through the aperture 70 in the slit section 7 enter the image transmit optical system 800. The transmit aperture stop 80 partly delimits and directs the light rays into a near parallel flux, which then reaches the beam splitter 91.

The polarization beam splitter 91 reflects light rays having a particular polarization direction, and directs them toward the $\lambda/4$ plate 92. The light rays then passes the $\lambda/4$ plate 92 and beam splitter 93, and then reach the beam splitter 94 to be reflected.

The beam splitter 93 has an infrared-light-transmissive property, and the beam splitter 94 has a reflective characteristic to the infrared light rays.

The light rays reflected by the beam splitter 94 enter the objective lens 100, and then are converged at the focal point of the objective lens 100 in connection with visible light and focused there to form the image of the aperture 70 in the slit section 7.

The rest of the operation of the image transmit means SB remains unchanged from the previous embodiments.

The image receive means SC comprises the objective lens 100, the beam splitters 93, 94, the $\lambda/4$ plate 92, the polarization beam splitter 91, and a image receiving optical system 1100 having a receive aperture stop 110.

The light rays reflected from the specimen 200 become a near parallel flux after passing through the objective lens 100. The flux is then reflected by the beam splitter 94 toward the beam splitter 93, passes through the beam splitter 93 and the $\lambda/4$ plate 92 and then reaches the polarization beam splitter 91.

The light rays that have passed through the polarization beam splitter 91 from the specimen 200 have traveled twice through the $\lambda/4$ plate 92 on their forward and return paths. Thus, the polarization of the light rays on their return path is rotated by 90 degrees with respect to the polarization state of the light rays that are reflected from the polarization splitter 91 on their forward path.

Since the polarization beam splitter 91 exhibits a light transmissive characteristic on the return path, the light rays reflected from the specimen 200 are transmitted through the polarization beam splitter 91 and enter the image receiving optical system 1100.

The light rays entering the image receiving optical system 1100 are partly delimited by the receiving aperture stop 110 and then enter the pickup face of an image pickup device 1200.

The rest of the operation of the image receiving means SC remains unchanged from the previous embodiments.

The photoelectric conversion means SD is constituted by the image pickup device 1200.

The image pickup device 1200 may be a charge couple device (CCD), for example, and is capable of measuring the luminous intensity distribution of the image of the aperture 70 in the slit section 7, re-focused on the pickup face of the pickup device.

The optical axis of the image receiving optical system 1100 at the image pickup device 1200 is arranged such that the image of the aperture 70 in the slit section 7 to be re-focused on the image pickup device 1200 is the sharpest when the focal point of the objective lens 100 for light rays in the visible wavelength range coincides with the specimen 200 to be detected as a surface of reflection.

The method for focal point detection in the optical microscope according to the present invention is now discussed.

A stage control unit 400 causes a stage 300 having the specimen mounted thereon to move sequentially in the direction of the optical axis of the objective lens 100. In the meantime, a focus control unit 1300 measures the sharpness of the luminous intensity distribution of the image of the aperture 70 in the slit section 7, re-focused on the image pickup device 1200. The focus control unit 1300 further stores the position of the stage 300 and the sharpness of the luminous intensity distribution.

The focus control unit 1300 causes the specimen 200 to be placed at the focal point of the optical microscope by pushing the stage 300 having the specimen 200 mounted thereon to a point of a maximum sharpness.

In the embodiment shown in FIG. 14, $\phi$RECEIVE, $\phi$TRANSMIT and $\phi$ILLUMINATE satisfy the already-described relationships. Even when the specimen 200 has an uneven surface, the luminous intensity distribution of the image of the aperture 70 in the slit 7 re-focused on the image pickup device 1200 is substantially like 150 in FIG. 9C, and the luminous intensity distribution of the image of the aperture 70 in the slit section 7 projected onto the specimen 200 is substantially like 140 in FIG. 9A.

The image having such a uniform intensity distribution permits a diversity of processing for the computation of sharpness.

For example, for the sharpness of the re-focused image, any of the following definitions may be perfectly acceptable:

the image condition maximizing the peak value of the luminous intensity distribution;

the image condition minimizing the width between two positions in which the intensity level is one-half the peak value of the luminous intensity distribution;

the image condition of the re-focused image whose intensity distribution matches best the stored luminous intensity distribution of the image projected onto the specimen 200;

the image condition that results in the steepest slope in the rising and falling edge of the intensity distribution; and the image condition that offers the maximum differential intensity between slit opening portions and shading portions if the aperture 70 is of a plurality of openings.

Any definition modified from one of the above may be also acceptable.

Figure 15A:
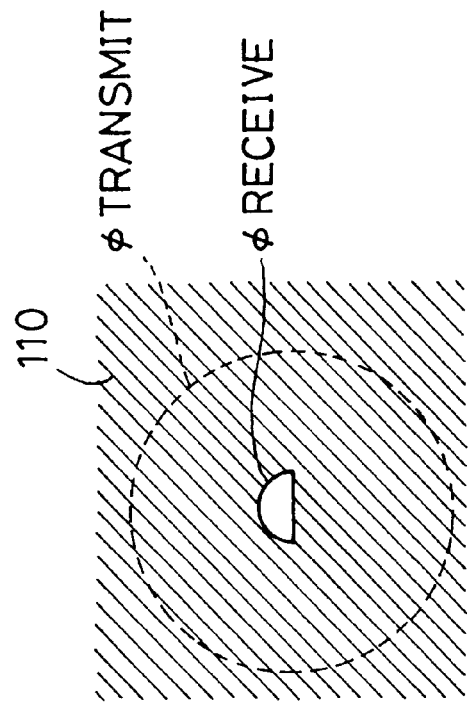
FIGS. 15A and 15B are schematic diagrams showing the positional relationship between the transmit light ray flux and the receive light ray flux at the pupil position in yet another embodiment.
Figure 15B:
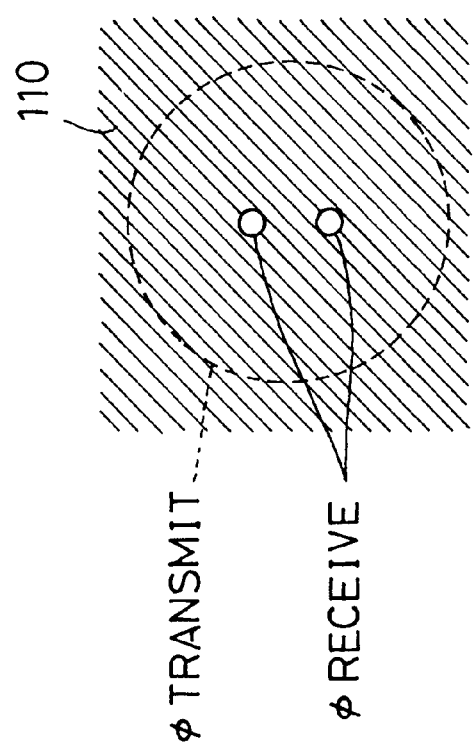
Figure 16A:
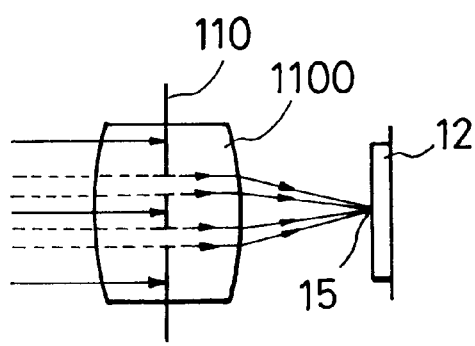
FIG. 16(A) is a schematic view of another embodiment in which the image of aperture 70 falls on position detection element 12 when the receive aperture φRECEIVE of FIG. 15(A) is used with the specimen 200 positioned at the focal point of the objective lens 100.
Figure 16B:
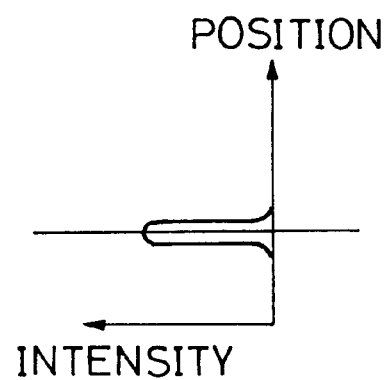
FIG. 16(B) is a graph showing the luminous intensity distribution of the image of aperture 70 on element 12 shown in FIG. 16(A).
Figure 16C:
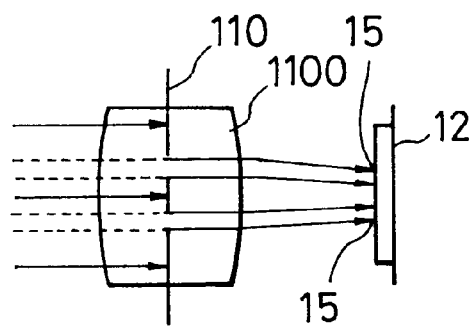
FIG. 16(C) is a schematic view showing the image of aperture 70 falling on element 12 when the receive aperture φRECEIVE of FIG. 15(A) is used with the specimen 200 positioned off the focal point of lens 100.
Figure 16D:
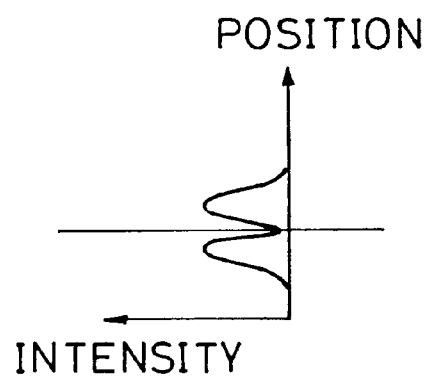
FIG. 16(D) is a graph showing the luminous intensity distribution of the image of aperture 70 on element 12 shown in FIG. 16(C).
Figure 17A:
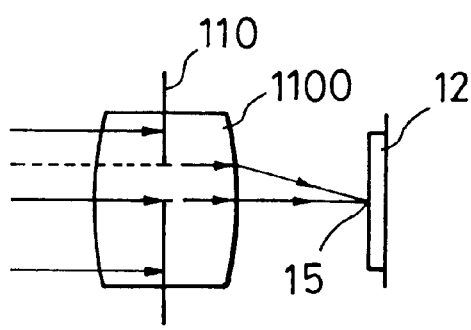
FIG. 17(A) is a schematic view of another embodiment in which the image of aperture 70 falls on element 12 when the receive aperture φRECEIVE of FIG. 15(B) is used with the specimen 200 positioned at the focal point of lens 100.
Figure 17B:
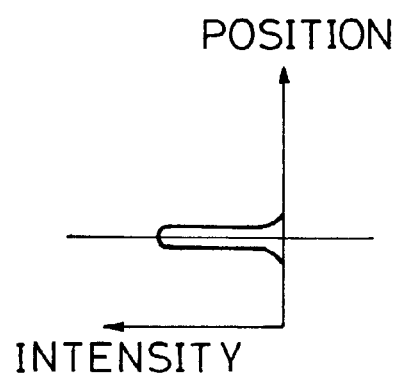
FIG. 17(B) is a graph showing the luminous intensity distribution of the image of aperture 70 on the element 12 shown in FIG. 17(A).
Figure 17C:
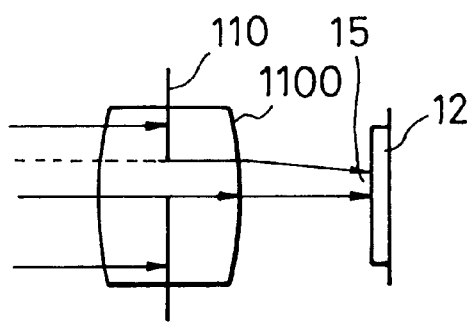
FIG. 17(C) is a schematic view showing the image of aperture 70 falling on element 12 when receive aperture φRECEIVE of FIG. 15(B) is used with the specimen 200 positioned off the focal point of lens 100.
Figure 17D:
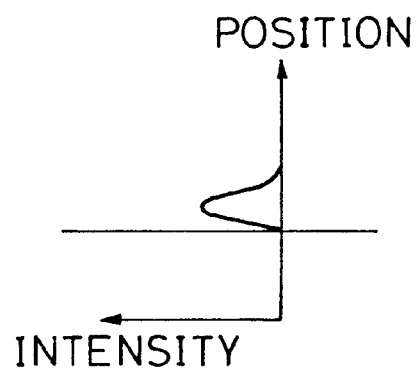
FIG. 17(D) is a graph showing the luminous intensity distribution of the image of aperture 70 one element 12 as seen in FIG. 17(C).

In the embodiment shown in FIG. 14, the receiving aperture stop 110 in the image receiving optical system 1100 may be configured as shown in FIGS. 15A and 15B, and the image pickup device 1200 may be replaced with the position detection element 12. Thus, the movement of the objective lens 100 of the specimen 200 in the direction of the optical axis is detected in the form of a variation of the image of the aperture 70 re-focused at the point of incidence 15 on the position detection element 12.

The position detection element 12 may be a CCD as is the image pickup device 1200, or it may be an analog device such as a photosensitive device (PSD).

The transmit aperture φTRANSMIT shown in FIGS. 15A and 15B has this shape when the surface of the specimen 200 to be detected is level with no inclination.

When the surface of the specimen 200 has an inclination θ, the transmit aperture φTRANSMIT is decentered with respect to the receiving aperture stop 110 in the image receiving optical system 1100.

The transmit aperture φTRANSMIT is sized to be sufficiently larger than the receiving aperture φRECEIVE so that, even with φTRANSMIT decentered, light quantity passing through φRECEIVE is equal to the light quantity that is obtained with no decentering taking place as shown in FIG. 15A and 15B.

By providing an aperture decentered at the pupil with respect to the optical axis, the deviation of the specimen 200 from the focal point of the objective lens 100 is detected as follows:

In FIG. 15A, the deviation of the specimen is detected as a shifting of the point of incidence of light on the position detection element 12 associated with a blurred or doubled image of the aperture 70 re-focused on the position detection element 12.

In FIG. 15B, the deviation of the specimen is detected as a shifting of the point of incidence of light on the position detection element 12 associated with a blurred image of the aperture 70 re-focused on the position detection element 12.

FIGS. 16A, 16B and FIGS. 17A, 17B respectively show the conditions of the image of the aperture 70 on the position detection element 12 when the receive apertures φRECEIVE shown in FIGS. 15A and 15B are used with the specimen 200 positioned at the focal point of the objective lens 100.

FIGS. 16C, 16D and FIGS. 17C, 17D respectively show the conditions of the image of the aperture 70 on the position detection element 12 when the receive apertures φRECEIVE in FIGS. 15A and 15B are used with the specimen 200 positioned away from the focal point of the objective lens 100.

FIGS. 16B, 16D, 17B and 17D show the luminous intensity distributions of the image of the aperture 70 on the position detection element 12.

In the embodiment shown in FIG. 14, φRECEIVE, φTRANSMIT and φILLUMINATE satisfy the already-described relationships even when receive apertures φRECEIVE shown in FIGS. 15A and 15B are used. Thus, even a specimen 200 with an uneven surface results in a good luminous intensity distribution of the image of the aperture 70 in the slit 7 re-focused on the position detection element 12, free from the effect of shading.

Such a good uniform intensity distribution of the image is easy to handle for the computation of its sharpness, and allows one to perform a diversity of determinations on in-focus conditions.

For example, as the position of the re-focused image, one of the following definitions may be perfectly acceptable:

the center of gravity of the luminous intensity distribution;

the peak value of the luminous intensity distribution; and the center of the width between two positions in which the intensity level is one-half the peak value of the luminous intensity distribution.

The objective lens 100 is regarded as being in-focus when the position of the image on the position detection element 12 coincides with a predetermined position on the position detection element 12.

The luminous intensity distribution of the in-focus image may be stored, and then, the objective lens 100 may be regarded as being in-focus when the luminous intensity distribution of the re-focused image on the position detection element 12 coincides with the stored luminous intensity distribution.

The determination of in-focus condition may be based on any definition modified from one of the above definitions for the position of the re-focused image.

The already-described operation for placing the specimen 200 in the focal point of the optical microscope equally applies herein.

In the embodiments shown in FIG. 14 and FIGS. 15A and 15B, if the objective lens 100 is provided with an aperture stop thereon, that aperture stop may replace the transmit aperture stop 80 and its function.

Embodiment 9

In the focal point detection device shown in FIGS. 1 and 14, the receiving aperture φRECEIVE in the image receiving means SC is smaller than the transmit aperture in the image transmit means SB. In a system, where the range of detection is sufficiently small, the reverse relationship may be acceptable. Specifically, the following relationship holds:

$4 \cdot |\theta| + \phi TRANSMIT \leq \phi RECEIVE$ holds true ($\theta = 1-3$ degrees).

Figures 18A, 18B:
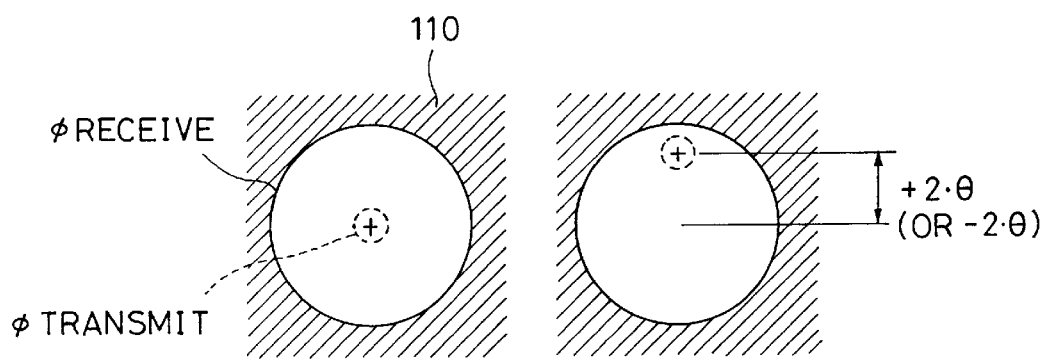
FIGS. 18A and 18B are schematic diagrams showing the positional relationship between the transmit light ray flux and the receive light ray flux at the pupil position with a transmit aperture and a receive aperture reversed in size in yet another embodiment.

FIGS. 18A and 18B show the aperture stops found in the embodiment of FIG. 1 but with the sizes of the transmit aperture stop 80 and the receive aperture stop 110 reversed.

FIGS. 18A and 18B show the positional relationship between φTRANSMIT and φRECEIVE on the receiving aperture stop 110 in the image receiving means SC obtained from the same surface to be detected as in FIGS. 3A and 3B.

The present invention works with the sizes of the transmit aperture stop 80 and the receiving aperture stop 110 reversed in FIG. 14.

In these cases, although the range of detection is narrowed, the illumination means SA may be simplified because the luminous intensity within the φILLUMINATE need not have a uniform distribution.

In the same manner as already described, when the taper angle (ψ) of the surface to be detected due to variations in the flatness of the surface to be detected cannot be neglected, the relationship $4 \cdot (|\theta| + |\psi|) + \phi TRANSMIT \leq \phi RECEIVE$ holds true.

The size of the cone angle φTRANSMIT determined by the transmit aperture stop 80 in the image transmit means SB is large enough to pick up at least +1st and −1st order diffraction light rays required to focus the image of the aperture 70 out of the diffraction light rays emitted from the aperture 70 in the slit section 7.

What is claimed is:

1. A surface position detection device comprising:

illumination means for illuminating an object;

a first imaging optical system for projecting the image of the object onto a surface to be detected;

a second imaging optical system for re-focusing the image of the object reflected from the surface to be detected;

photodetector means for detecting the image re-focused by said second imaging optical system; and means for detecting the position of the surface to be detected, based on a signal generated by said photodetector means, said first imaging optical system comprising a first aperture member defining the cone angle of a light ray flux projected onto the object, which is denoted as $\phi$TRANSMIT, and said second imaging optical system comprising a second aperture member defining the cone angle of the light ray flux, reflected from the surface to be detected, and detected by said photodetector means, which is denoted as $\phi$RECEIVE, wherein $\phi$TRANSMIT>$\phi$RECEIVE.

2. A surface position detection device according to claim 1, wherein $\phi$TRANSMIT$\geq$4·|$\theta$|+($\phi$RECEIVE), and wherein $\theta$ is substantially in the range of 1–3 degrees.

3. A surface position detection device according to claim 1, wherein $\phi$TRANSMIT=4·|$\theta$|+($\phi$RECEIVE), wherein $\theta$ is substantially in the range of 1–3 degrees.

4. A surface position detection device according to claim 1, wherein $\phi$ILLUMINATE$\geq$|$\beta$TRANSMIT|·$\phi$TRANSMIT, wherein $\phi$ILLUMINATE represents the cone angle of a light ray flux with which said illumination means illuminates the object, and $\beta$TRANSMIT represents the imaging magnification of said first imaging optical system.

5. A surface position detection device according to claim 1, wherein said first imaging optical system obliquely projects the image of the object to the surface to be detected, and said second imaging optical system directs the image of the object obliquely reflected from the surface to be detected, onto said photodetector means.

6. A surface position detection device according to claim 1, wherein said first imaging optical system is a telecentric optical system to the output side of said first imaging optical system facing the surface to be detected, and said second imaging optical system is a telecentric optical system on the input side of said second imaging optical system facing the surface to be detected.

7. A surface position detection device according to claim 1, wherein the object is optically conjugate with the surface to be detected, and the surface to be detected is optically conjugate with the pickup face of said photodetector means.

8. A surface position detection device according to claim 1, wherein said illumination means comprises means for causing the luminous intensity per unit cone angle within the cone angle of the light ray flux projected onto the object to be uniform.

9. A surface position detection device according to claim 1, wherein the surface to be detected is a resist-coated surface of a wafer.

10. A position detection device comprising:

illumination means for illuminating an object;

a first imaging optical system for projecting the image of the object onto a surface to be detected;

a second imaging optical system for re-focusing the image of the object reflected from the surface to be detected;

photodetector means for detecting the image re-focused by said second imaging optical system; and means for detecting the position of the surface to be detected, based on a signal generated by said photodetector means, said first imaging optical system comprising a first aperture member defining the cone angle of a light ray flux projected onto the object, which is denoted as $\phi$TRANSMIT, and said second imaging optical system comprising a second aperture member defining the cone angle of a light ray flux, reflected from the surface to be detected, and detected by the photodetector means, which is denoted as $\phi$RECEIVE, wherein $\phi$TRANSMIT<$\phi$RECEIVE.

11. A position detection device according claim 10, wherein, 4·|$\theta$|+$\phi$TRANSMIT$\leq$$\phi$RECEIVE, wherein $\theta$ is substantially in the range of 1–3 degrees.

12. A position detection device according to claim 10, wherein, 4·|$\theta$|+$\phi$TRANSMIT=$\phi$RECEIVE, wherein $\theta$ is substantially in the range of 1–3 degrees.

13. A position detection device according to claim 10, wherein, $\phi$ILLUMINATE$\geq$|$\beta$TRANSMIT|·$\phi$TRANSMIT, wherein $\phi$ILLUMINATE represents the cone angle of a light ray flux with which said illumination means illuminates the object, and $\beta$TRANSMIT represents the imaging magnification of said second imaging optical system.

14. A position detection device according to claim 10, wherein said first imaging optical system obliquely projects the image of the object to the surface to be detected, and said second imaging optical system directs the image of object obliquely reflected from the surface to be detected, onto said photodetector means.

15. A position detection device according to claim 10, wherein the surface to be detected is a resist-coated surface of a wafer.

* * * * *

UNITED STATES PATENT AND TRADEMARK OFFICE
CERTIFICATE OF CORRECTION

PATENT NO. : 5,955,739
DATED     : September 21, 1999
INVENTOR  : HARUNA KAWASHIMA It is certified that error appears in the above-identified patent and that said Letters Patent is hereby corrected as shown below:

ON THE COVER PAGE AT ITEM [56]:
Under "U.S. PATENT DOCUMENTS", "5,124,563" should read --5,124,562--.

COLUMN 1:
Line 18, "plurality" should read --plurality of--; and
Line 28, "a" (2nd occurrence) should read --an--.

COLUMN 2:
Line 33, "for" should be deleted.

COLUMN 15:
Line 37, "passes" should read --pass--.

COLUMN 19:
Line 43, "to" should read --on--.

Signed and Sealed this

Tenth Day of April, 2001

Attest:

NICHOLAS P. GODICI

Attesting Officer      Acting Director of the United States Patent and Trademark Office